(12) United States Patent
Dark

(10) Patent No.: US 6,179,975 B1
(45) Date of Patent: Jan. 30, 2001

(54) METHOD OF MONITORING TARGET/COMPONENT CONSUMPTION FOR DUAL USE TITANIUM/TITANIUM NITRIDE SPUTTERING

(75) Inventor: Charles A. Dark, Arlington, TX (US)

(73) Assignee: National Semiconductor Corporation, Santa Clara, CA (US)

( * ) Notice: Under 35 U.S.C. 154(b), the term of this patent shall be extended for 0 days.

(21) Appl. No.: 08/725,109

(22) Filed: Oct. 2, 1996

(51) Int. Cl.$^7$ .................................................. C23C 14/34
(52) U.S. Cl. ........................................................ 204/192.13
(58) Field of Search ..................... 204/192.13, 298.03, 204/192.12

(56) References Cited

U.S. PATENT DOCUMENTS

| | | | | |
|---|---|---|---|---|
| 4,166,783 | * | 9/1979 | Turner ............................... | 204/192 R |
| 5,427,666 | * | 6/1995 | Mueller et al. .................. | 204/192.17 |
| 5,487,823 | * | 1/1996 | Sawada et al. .................. | 204/192.13 |

* cited by examiner

Primary Examiner—Nam Nguyen
Assistant Examiner—Steven H. Ver Steeg
(74) Attorney, Agent, or Firm—Skjerven Morrill MacPherson; Edward C. Kwok

(57) ABSTRACT

In the monitoring of the consumption of a target of, for example, titanium for providing titanium and/or titanium nitride film, the process work in kilowatt-hours ($Y_1$) is determined for complete consumption of the target when providing only titanium, and the process work in kilowatt-hours ($Y_2$) is also determined for complete consumption of the target in providing only titanium nitride. The target life is then determined in accordance with the formula;

$$\text{Target Life} = \frac{Y_2 - Y_1}{X_2 - X_1}\left(\text{ARCTAN}\left(\frac{W_2}{W_1}\right)\right) + Y_1$$

where:

$Y_2$ and $Y_1$ are defined as above;
$W_2$=actual titanium nitride process work;
$W_1$=actual titanium process work;

$$X_2 = \text{ARCTAN}\left[\lim_{W_1 \to 0}\left(\frac{W_2}{W_1}\right)\right]$$
$$= 1.57 \text{ radians};$$

$$X_1 = \text{ARCTAN}\left[\lim_{W_2 \to 0}\left(\frac{W_2}{W_1}\right)\right]$$
$$= 0 \text{ radians}.$$

2 Claims, 3 Drawing Sheets

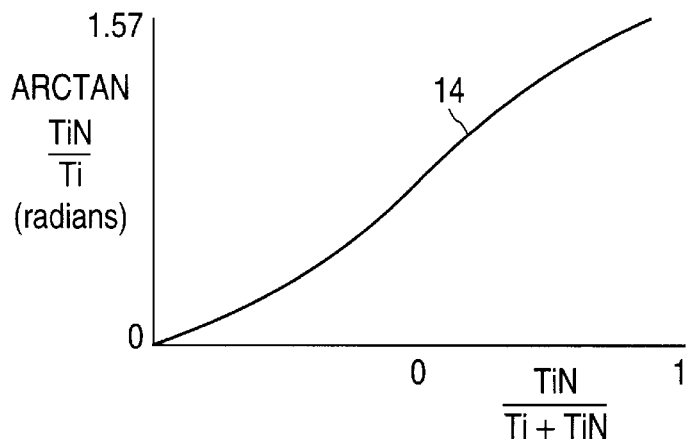
FIG. 4
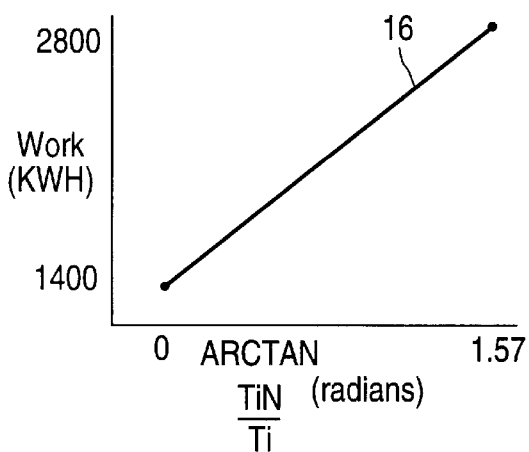
FIG. 5
| Ti KWH (W₁) | 0   | TOTAL WORK KWH | TARGET LIFE KWH |
|---|---|---|---|
| TiN KWH (W₂) | 0 | | |
| ⊢——1400——⊣ | | 0 | 1400 |
| Ti KWH (W₁) | 300 | | |
| TiN KWH (W₂) | 0 | | |
| ⊢——1400——⊣ | | 300 | 1400 |
| Ti KWH (W₁) | 300 | | |
| TiN KWH (W₂) | 200 | | |
| ⊢——1925.69——⊣ | | 500 | 1925.69 |
FIG. 7

METHOD OF MONITORING TARGET/ COMPONENT CONSUMPTION FOR DUAL USE TITANIUM/TITANIUM NITRIDE SPUTTERING

FIELD OF THE INVENTION

This invention relates to sputtering, and more particularly, to a method wherein sputtering target usage is monitored.

BACKGROUND OF THE INVENTION

In a typical sputtering operation (FIG. 1), a target 4 of for example titanium is provided on an aluminum support within a sputtering chamber 6, and power is supplied to the target to cause it to sputter onto an object 8 such as a semiconductor wafer within the chamber. In such a situation, if it is desired that a pure titanium film be provided on the object, the sputtering is undertaken in the presence of pure argon. If a titanium nitride film is desired, the sputtering is undertaken in the presence of argon and nitrogen.

Typically, a sputtering machine of this sort has a kilowatt-hour counter which indicates the work undertaken in removal of target material. In a typical machine, for example, sputtering of an entire target of titanium to exclusively produce titanium film completely consumes the titanium target in 1400 kilowatt-hours. Meanwhile, the complete titanium target is consumed in 2800 kilowatt-hours for exclusive production of titanium nitride film.

If a sputtering process requires both such films to be deposited on an object, the target will be exhausted somewhere in between these two kilowatt-hour values. Furthermore, if two processes are being run, one depositing only titanium film and the other providing a titanium/titanium nitride sandwich layer, the end of target life will depend on the product volume through each process.

Typically, a sputtering machine has only a kilowatt-hour counter to sum up the amount of work undertaken, and thus there is no differentiation between one process and another to aid one in understanding how much target life is left. This understanding is important because the complete burning through of the target can lead to the ruining of product and also damage to the machine.

SUMMARY OF THE INVENTION

The present invention is a method of monitoring the consumption of a target of, for example, titanium used in providing titanium and/or titanium nitride on such object. Initially, the process work in kilowatt-hours ($Y_1$) is determined for complete consumption of the target when providing only titanium, and the process work in kilowatt-hours ($Y_2$) is also determined for complete consumption of the target in providing only titanium nitride. The target life is then determined in accordance with the formula;

$$\text{Target Life} = \frac{Y_2 - Y_1}{X_2 - X_1}\left(\text{ARCTAN}\left(\frac{W_2}{W_1}\right)\right) + Y_1$$

where:

$Y_2$ and $Y_1$ are defined as above;

$W_2$ = actual second material process work;

$W_1$ = actual first material process work;

$$X_2 = \text{ARCTAN}\left[\lim_{W_1 \to 0}\left(\frac{W_2}{W_1}\right)\right]$$
$$= 1.57 \text{ radians};$$

$$X_1 = \text{ARCTAN}\left[\lim_{W_2 \to 0}\left(\frac{W_2}{W_1}\right)\right]$$
$$= 0 \text{ radians}.$$

While the ARCTAN function is indicated in the above formula, any function which substantially mimics the ARCTAN function is suitable.

plotted against the ratio of $$\frac{\text{TiN}}{\text{Ti} + \text{TiN}};$$

FIG. 4 is a graph of $$\text{ARCTAN}\frac{\text{TiN}}{\text{Ti}}$$

(in radians) plotted against $$\frac{\text{TiN}}{\text{Ti} + \text{TiN}};$$

FIG. 5 is a graph of work in kilowatt-hours used in sputtering plotted against $$\text{ARCTAN}\frac{\text{TiN}}{\text{Ti}}$$

Figure 6:
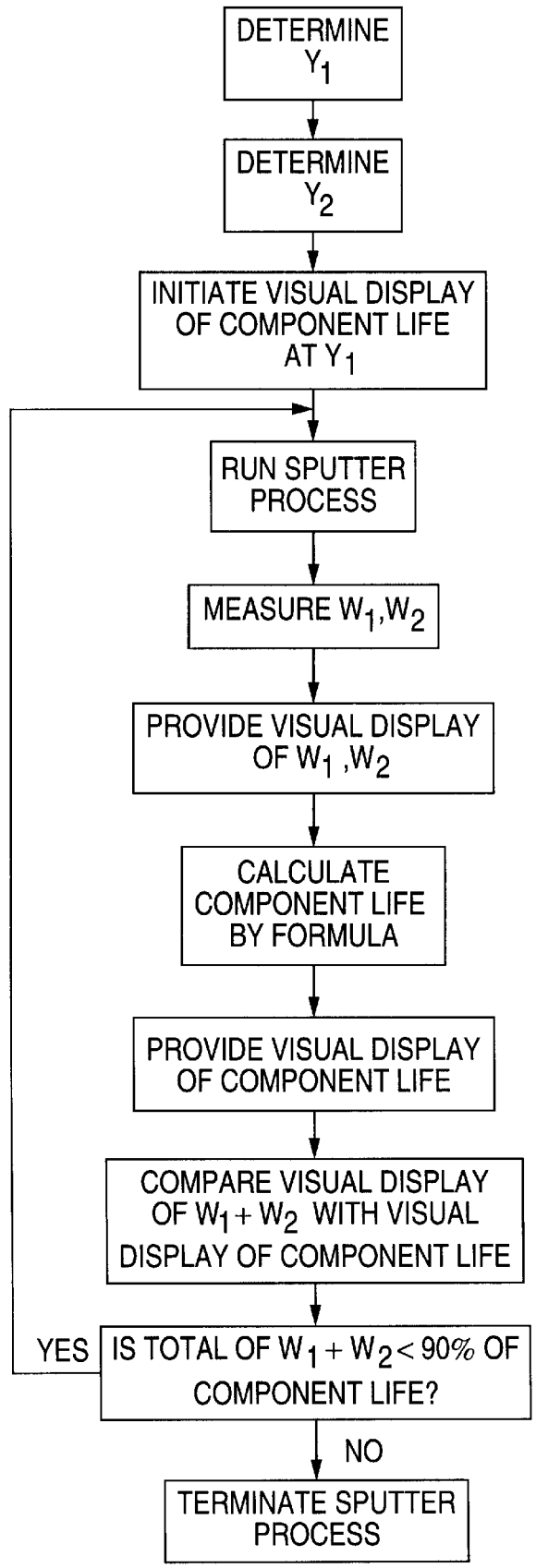

(in radians);

FIG. 6 is a flow diagram of the sent process; and

FIG. 7 is a series of views showing visual readouts of the present process.

DESCRIPTION OF THE PREFERRED EMBODIMENT

Figure 1:
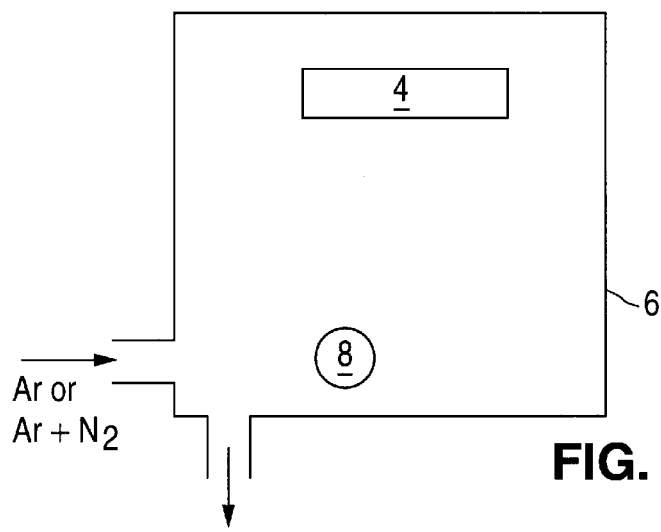
FIG. 1 is a simplified view of a sputtering apparatus.
Figure 2:
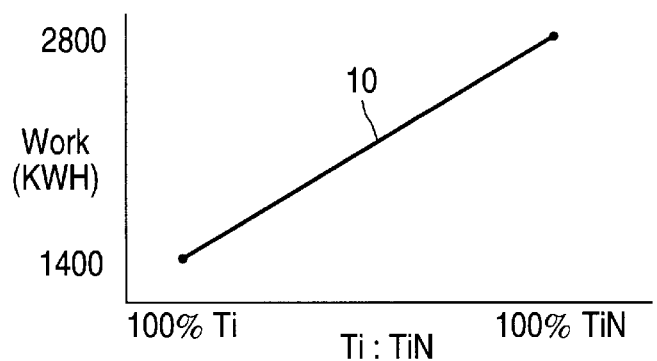
FIG. 2 is a graph showing work in kilowatt-hours used in the sputtering process plotted against a range from 100% Ti deposited to 100% TiN deposited.

Referring to the graph of FIG. 2, the extreme points of the line 10 indicate, as set forth above, that the sputtering of a Ti target to produce 100% Ti film requires 1400 kilowatt-hours of work ($Y_1$), while the sputtering of a Ti target to produce 100% TiN requires 2800 kilowatt-hours of work ($Y_2$), to entirely consume the Ti target. A combination of the processes (i.e.; part Ti deposited and part TiN deposited) indicates a linear relationship between the two points as shown in FIG. 2.

Figure 3:
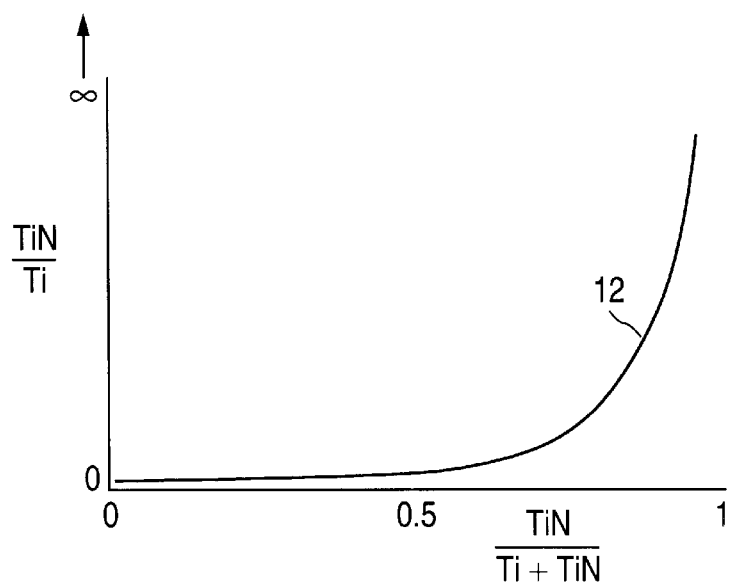
FIG. 3 is a graph of the ratio of $$\frac{\text{TiN}}{\text{Ti}}$$

If the proportion of $$\frac{\text{work TiN}}{\text{work Ti}}$$

is plotted against $$\frac{\text{work TiN}}{\text{work Ti} + \text{work TiN}}$$

as shown in FIG. 3, the plot 12 takes the configuration shown, such that as, for example, $$\frac{\text{work TiN}}{\text{work Ti}}$$

increases, $$\frac{\text{work TiN}}{\text{work Ti} + \text{work TiN}}$$

will approach 1.

In order to derive a generally linear relationship based on the data of FIG. 3, it will be noted that if $$\text{ARCTAN} \frac{\text{work TiN}}{\text{work Ti}}$$

(in radians) is plotted against $$\frac{\text{work TiN}}{\text{work Ti} + \text{work TiN}},$$

the plotted relationship 14 is substantially linear (FIG. 4). It will be noted that while the ARCTAN function is used to establish this substantially linear relationship, any function which would mimic this substantially linear relationship may be chosen. Thus, all such substantial equivalents can be considered encompassed herein. Combining elements of FIG. 2 and FIG. 4, if the work in kilowatt-hours ranging from 1400 kilowatt-hours to 2800 kilowatt-hours is plotted against $$\text{ARCTAN} \frac{\text{work TiN}}{\text{work Ti}}$$

(in radians), a substantially linear relationship 16 is established (FIG. 5).

From the above data, the following formula can be developed.

$$\text{Target Life} = \frac{Y_2 - Y_1}{X_2 - X_1} \left( \text{ARCTAN}\left(\frac{W_2}{W_1}\right)\right) + Y_1$$

where:

$Y_2$ and $Y_1$ are defined as above;
$W_2$=actual second material process work;
$W_1$=actual first material process work;

$$X_2 = \text{ARCTAN} \left[ \lim_{W_1 \to 0} \left(\frac{W_2}{W_1}\right)\right]$$

= 1.57 radians;

$$X_1 = \text{ARCTAN} \left[ \lim_{W_2 \to 0} \left(\frac{W_2}{W_1}\right)\right]$$

= 0 radians.

Prior to processing being undertaken, the indicated target life is the work needed to completely consume the target if the target is used only for providing titanium film=1400 kilowatt-hours. At any given pint during the sputtering process, $$\text{ARCTAN} \frac{\text{work TiN}}{\text{work Ti}}$$

has a value which determines "Target Life". For example, assume that the process for sputtering Ti has been run for 300 kilowatt-hours, and the process for sputtering TiN has not yet been run:

$$\text{Target Life} = \frac{2800 - 1400}{1.57 - 0}\left(\text{ARCTAN}\left(\frac{0}{300}\right)\right) + 1400$$

$$= \frac{1400}{1.57}(0) + 1400$$

$$= 1400 \text{ kilowatt-hours}$$

Then, assuming that the process for sputtering TiN is run for 200 kilowatt-hours:

$$\text{Target Life} = \frac{2800 - 1400}{1.57 - 0}\left(\text{ARCTAN}\left(\frac{200}{300}\right)\right) + 1400$$

$$= \frac{1400}{1.57}(\text{ARCTAN}(.667)) + 1400$$

$$= 891(.59) + 1400 = 1925.69 \text{ kilowatt-hours}$$

Thus, the use of the Ti target for sputtering TiN, needing more work than sputtering of Ti, results in an increased indicated target life from 1400 kilowatt-hours to 1925.69 kilowatt-hours.

Since the ratio of $$\frac{\text{work TiN}}{\text{work Ti}}$$

changes as the process goes on, the target life as determined by the formula changes, and is updated on an ongoing basis to provide appropriate information useful to the operator of the machine.

The actual process flow is shown in FIG. 6.

Initially, $Y_1$, the work needed to completely consume the target if only titanium film is provided, is determined. Then, $Y_2$, the work needed to completely consume the target if only titanium nitride film is provided, is determined.

At this point, a visual display (FIG. 7) on the screen of a computer can be initiated, indicating a bar the length of which indicates 1400 kilowatt-hours, i.e., $Y_1$. Then, the sputter process is run, and the work undertaken at a given point in time used in sputtering titanium and titanium nitride, i.e., $W_1$ and $W_2$, are measured. A visual display of $W_1$ and $W_2$ is provided on the screen, and the above-cited formula is used to calculate target life. Then, the visual display is updated to provide target life as determined by the formula.

Next, the visual display of $W_1$ and $W_2$ are compared with the visual display of component life. If the total of $W_1$ and $W_2$ is less than 90% of the component life as determined by the formula, the process loops back to continue running the sputter process. Then, the updated $W_1$ and $W_2$ are measured, etc., until again the point is reached wherein the total of $W_1$ and $W_2$ is 90% of component life. At this point, the sputter process is terminated, indicating that a substantial amount of the target has been used and the target should be changed.

It will further be understood that a mechanism can be readily be included to change the color of the bar from, for example, green to red when total $W_1+W_2=90\%$ of component life and can in fact include a yellow sector when, for example, 80% is reached.

Thus, it will readily be seen that a method for monitoring the consumption of a target is provided. This method is readily practiced and lends itself to the ready avoidance of burning through a target, causing the entire process flow to break down. Such method further provides for consistent and complete use of target material so as to minimize material waste.

What is claimed is:

1. A method for monitoring, in a sputtering process for depositing material on a sample, consumption of a target, said target including a component of both a first material and a second material, comprising:

provisioning process work $Y_1$ required for complete consumption of the target when used only to provide the first material on the sample;

determining process work $Y_2$ required for complete consumption of the target when used only to provide the second material on the sample; and determining a target life in accordance with a formula relating said process work $Y_2$ and said process work $Y_1$ with actual material process work for each of said first and second materials, wherein said formula is provided by:

$$\text{Target Life} = \frac{Y_2 - Y_1}{X_2 - X_1}\left(\text{ARCTAN}\left(\frac{W_2}{W_1}\right)\right) + Y_1$$

where:
$Y_2$ and $Y_1$ are defined as above;
$W_2$=actual second material process work;
$W_1$=actual first material process work;

$$X_2 = \text{ARCTAN}\left(\lim_{w_1 \to 0}\left(\frac{W_2}{W_1}\right)\right);$$

$$X_1 = \text{ARCTAN}\left(\lim_{w_2 \to 0}\left(\frac{W_2}{W_1}\right)\right).$$

2. A method for monitoring consumption of a Ti target used in a sputtering process to provide Ti on a sample and TiN on the sample, comprising:

providing a Ti target;

determining process work $Y_1$ required for complete consumption of the target when used to provide only Ti on the sample;

determining process work $Y_2$ required for complete consumption of the target when used to provide only TiN on the sample;

determining target life in accordance with a formula relating said process works $Y_1$ and $Y_1$ and actual process work of Ti and TiN;

updating said target life at regular intervals as said process works for Ti and TiN change during processing;

providing a visual representation of target life calculation, providing a visual representation of said actual process works for Ti and TiN; and updating the visual representation of said actual process works for Ti and TiN at regular intervals, wherein said target life is provided by:

$$\text{Target Life} = \frac{Y_2 - Y_1}{X_2 - X_1}\left(\text{ARCTAN}\left(\frac{W_2}{W_1}\right)\right) + Y_1$$

where:
$Y_2$ and $Y_1$ are defined as above;
$W_2$=actual process work for TiN;
$W_1$=actual first material process work for Ti;

$$X_2 = \text{ARCTAN}\left(\lim_{w_1 \to 0}\left(\frac{W_2}{W_1}\right)\right);$$

$$X_1 = \text{ARCTAN}\left(\lim_{w_2 \to 0}\left(\frac{W_2}{W_1}\right)\right).$$

* * * * *

UNITED STATES PATENT AND TRADEMARK OFFICE
CERTIFICATE OF CORRECTION

PATENT NO.    : 6,179,975 B1  Page 1 of 1
DATED         : January 30, 2001
INVENTOR(S)   : Charles A. Dark It is certified that error appears in the above-identified patent and that said Letters Patent is hereby corrected as shown below:

Column 2,
Line 52, please delete "sent" and insert -- present --;

Column 4,
Line 12, please delete "pint" and insert -- point --;

Column 6,
Line 22, please delete "$Y_1$ and $Y_1$" and insert -- $Y_2$ and $Y_1$ --.

Signed and Sealed this

Seventeenth Day of December, 2002

JAMES E. ROGAN
*Director of the United States Patent and Trademark Office*